United States Patent
Lee et al.

(10) Patent No.: US 11,276,441 B2
(45) Date of Patent: Mar. 15, 2022

(54) SEMICONDUCTOR DEVICE INCLUDING INPUT/OUTPUT PAD

(71) Applicant: SK hynix Inc., Gyeonggi-do (KR)

(72) Inventors: Seong Ju Lee, Gyeonggi-do (KR); Ju Hyuck Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/076,492

(22) Filed: Oct. 21, 2020

(65) Prior Publication Data
US 2021/0327480 A1 Oct. 21, 2021

(30) Foreign Application Priority Data
Apr. 17, 2020 (KR) .................. 10-2020-0046510

(51) Int. Cl.
*G11C 5/06* (2006.01)
*G11C 7/22* (2006.01)
*G11C 7/10* (2006.01)
*G11C 8/18* (2006.01)

(52) U.S. Cl.
CPC ............ *G11C 7/222* (2013.01); *G11C 7/1039* (2013.01); *G11C 7/1057* (2013.01); *G11C 7/1084* (2013.01); *G11C 8/18* (2013.01)

(58) Field of Classification Search
CPC .................................. G11C 7/222; G11C 5/06
USPC .................................................. 365/63, 233.1
See application file for complete search history.

(56) References Cited

U.S. PATENT DOCUMENTS

2011/0063925 A1* 3/2011 Mizukane ........... G11C 11/4093
365/189.05

FOREIGN PATENT DOCUMENTS

| KR | 10-2004-0066998 | 7/2004 |
|----|----|----|
| KR | 10-2015-0062472 | 6/2015 |
| KR | 10-1626527 | 6/2016 |

* cited by examiner

*Primary Examiner* — Hoai V Ho
(74) *Attorney, Agent, or Firm* — IP & T Group LLP

(57) ABSTRACT

A memory device includes a data pad disposed in a first pad area and configured to receive data, a data strobe pad disposed in the first pad area and configured to receive a data strobe signal, a clock pad disposed in a second pad area adjacent to the first pad area and configured to receive a clock signal, a data conversion circuit disposed in the first pad area and configured to convert the data inputted through the data pad into parallel data based on the data strobe signal, and a data driving circuit disposed in the first pad area and configured to transmit the parallel data through a global input and output line based on the clock signal.

19 Claims, 3 Drawing Sheets

SEMICONDUCTOR DEVICE INCLUDING INPUT/OUTPUT PAD

CROSS-REFERENCE TO RELATED APPLICATION

This application claims priority under 35 U.S.C. § 119 to Korean Patent Application No. 10-2020-0046510 filed on Apr. 17, 2020, which is incorporated herein by reference in its entirety.

BACKGROUND

1. Field

Various embodiments relate to a semiconductor device, and more particularly, to a memory device that aligns and processes data sequentially inputted or outputted through an input and output pad.

2. Discussion of the Related Art

As the operating speed of a semiconductor system such as a memory system increases, a memory device included in the memory system is required to have a high data transfer rate. Particularly, a memory device applied to a mobile environment needs to transmit data at a higher bandwidth as users' performance expectations become higher.

The memory device may align input/output data in a multi-bit prefetch method in order to process the data at a high transfer rate and a high bandwidth. That is, in a write operation, the memory device may align data that are sequentially inputted and then store the aligned data in a memory cell array in parallel. In a read operation, the memory device may read the data from the memory cell array in parallel and then sequentially output the data.

While data is inputted to a memory device in synchronization with a data strobe signal, the inputted data may be processed in synchronization with a clock signal. Accordingly, the memory device needs to perform a domain crossing operation for allowing data synchronized with the data strobe signal to be synchronized with the clock signal.

SUMMARY

Various embodiments are directed to a semiconductor device having an optimized arrangement of a plurality of input/output pads and circuits for aligning input/output data, within a limited area.

In accordance with an embodiment, a memory device may include: a data pad disposed in a first pad area and configured to receive data; a data strobe pad disposed in the first pad area and configured to receive a data strobe signal; a clock pad disposed in a second pad area adjacent to the first pad area and configured to receive a clock signal; a data conversion circuit disposed in the first pad area and configured to convert the data inputted through the data pad into parallel data based on the data strobe signal; and a data driving circuit disposed in the first pad area and configured to transmit the parallel data through a global input and output line based on the clock signal.

In accordance with an embodiment, a memory device may include: a plurality of data pads disposed in a first pad area and configured to input and output data; a plurality of voltage pads disposed in the first pad area and configured to receive a power supply voltage and a ground voltage; a plurality of clock pads disposed in a second pad area adjacent to the first pad area and configured to receive a clock signal; and a data alignment circuit disposed in the first pad area and configured to align the inputted and outputted data in response to the clock signal, wherein two data pads of the plurality of data pads correspond to one voltage pad of the plurality of voltage pads, which is disposed between the two data pads.

In accordance with an embodiment, a semiconductor device may include: a core area; and a pad area including a first pad area and a second pad area disposed adjacent to the first pad area, wherein a plurality of data pads configured to input and output data, a data strobe pad configured to receive a data strobe signal, and a plurality of voltage pads configured to receive a power supply voltage and a ground voltage are disposed in the first pad area, wherein a clock pad configured to receive a clock signal is disposed in the second pad area, and wherein a data alignment circuit configured to align the inputted and outputted data in response to the clock signal, is disposed in the first pad area to be overlapped with the plurality of data pads and the plurality of voltage pads.

DETAILED DESCRIPTION

Figure 1:
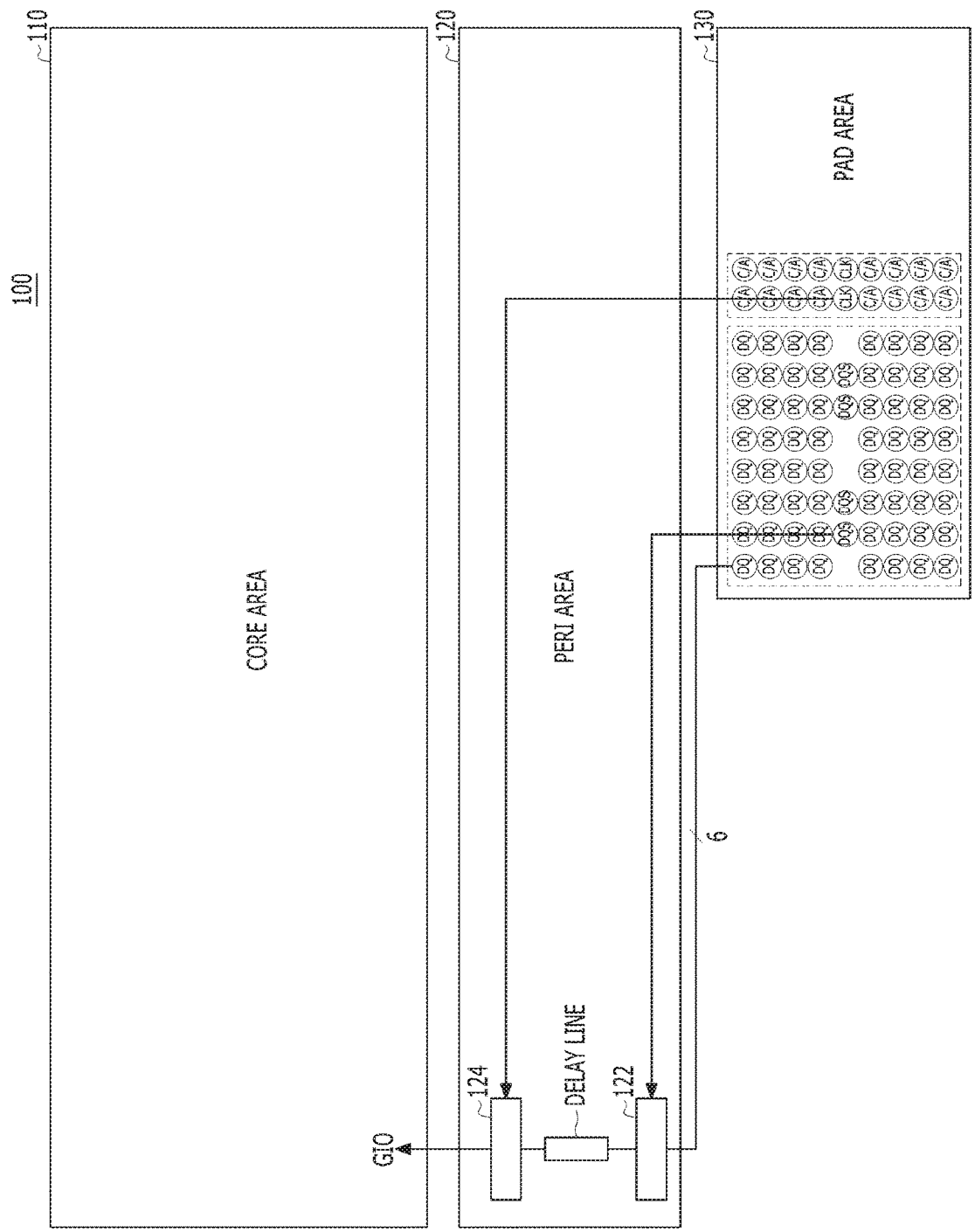
FIG. 1 is diagram illustrating a memory device that performs a multi-bit prefetch operation.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

FIG. 1 is diagram illustrating a memory device 100 that performs a multi-bit prefetch operation. The memory device 100 may include a core area (CORE AREA) 110, a peripheral area (PERI AREA) 120, and a pad area (PAD AREA) 130.

The memory device 100 may include a plurality of memory cells (not illustrated) in the core area 110. In a write operation, the memory device 100 may align data that are sequentially inputted and then store the aligned data in parallel in the plurality of memory cells. In a read operation, the memory device 100 may read the data in parallel from the plurality of memory cells and then sequentially output the read data.

For such an operation, the memory device 100 may sequentially input and output data in synchronization with a data strobe signal, and process internally transmitted data in synchronization with a clock signal. Referring to FIG. 1, the memory device 100 may include a data strobe domain circuit 122 and a clock domain circuit 124, in the peri area 120. The data strobe domain circuit 122 may align data in response to the data strobe signal, and the clock domain circuit 124 may process the aligned data in response to the clock signal.

Furthermore, the memory device 100 may include a plurality of input/output pads in the pad area 130. The plurality of input/output pads may be divided into data pads DQ and data strobe pads DQS for inputting/outputting the data and the data strobe signal, and command/address pads C/A and clock pads CLK for receiving commands/addresses and the clock signal.

The memory device 100 may perform a domain crossing operation for allowing data synchronized with the data strobe signal, to be synchronized with the clock signal. That is, the memory device 100 may adjust a delay of data by reflecting a timing difference between the data strobe signal and the clock signal.

Referring to FIG. 1, when the data strobe domain circuit 122 and the clock domain circuit 124 are disposed in the peri area 120, a length difference between a signal path from the data strobe pad DQS to the data strobe domain circuit 122 and a signal path from the clock pad CLK to the clock domain circuit 124 may increase. In order to match a timing with the clock signal transmitted through a relatively long path, the memory device 100 may include a delay line for delaying data outputted from the data strobe domain circuit 122, in the peripheral area. The delay line may have a relatively large amount of delay, and therefore, increase the area of the memory device 100.

Figure 2:
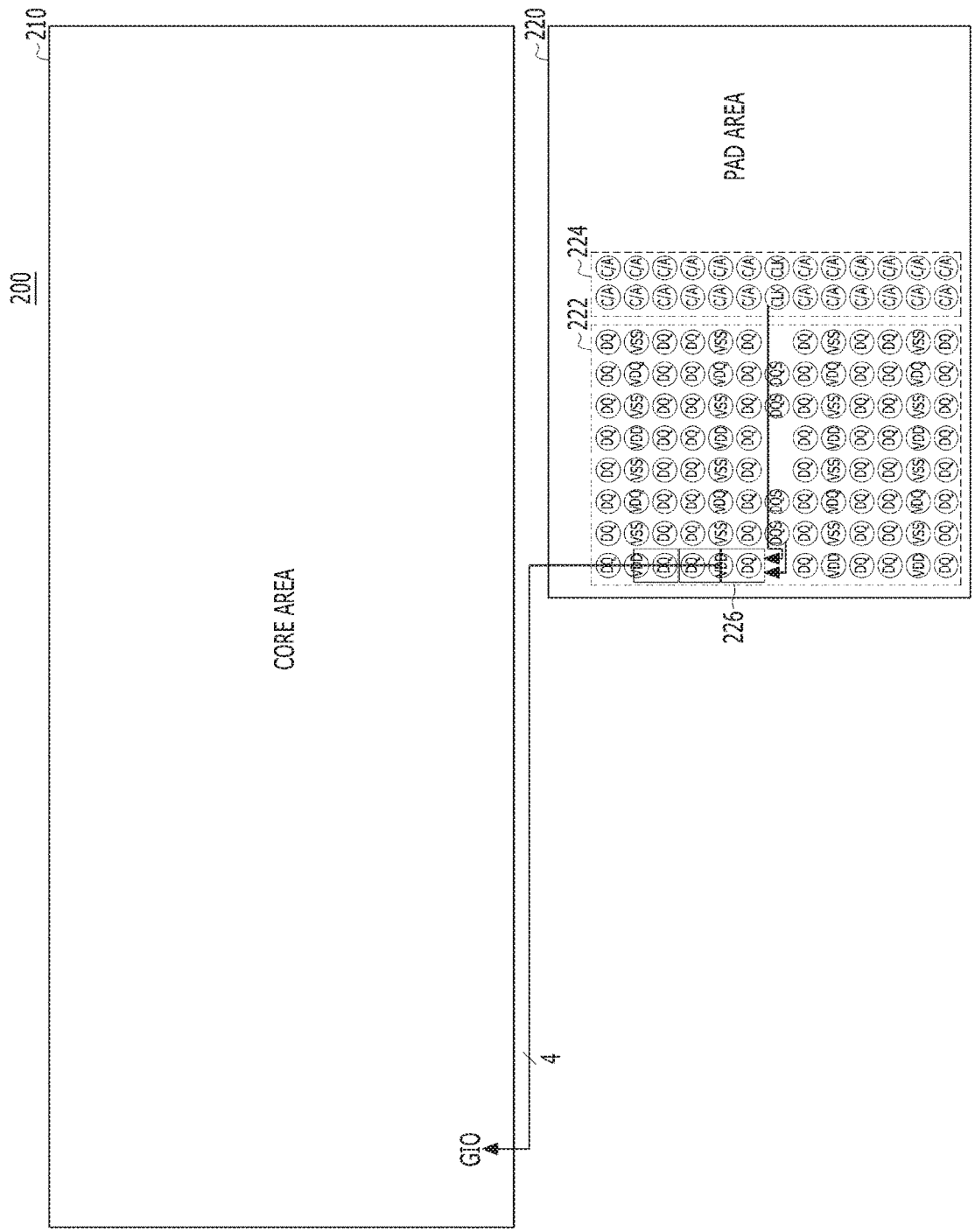
FIG. 2 is a diagram illustrating a memory device in accordance with an embodiment of the present disclosure.

FIG. 2 is a diagram illustrating a memory device 200 in accordance with an embodiment of the present disclosure. The memory device 200 may include a core area 210 and a pad area 220.

As described above, the memory device 200 may include a plurality of memory cells (not illustrated) in the core area 210. In a write operation, the memory device 200 may align data that are sequentially inputted and then store the aligned data in parallel in the plurality of memory cells. In a read operation, the memory device 200 may read the data in parallel from the plurality of memory cells and then sequentially output the read data.

The pad area 220 of the memory device 200 may be divided into a first pad area 222 and a second pad area 224 disposed adjacent to the first pad area 222. In the first pad area 222, data pads DQ and data strobe pads DQS for inputting and outputting data and a data strobe signal may be disposed. In the second pad area 224, command/address pads C/A and dock pads CLK for receiving a commands/addresses and a clock signal may be disposed.

In accordance with an embodiment of the present disclosure, a data alignment circuit 226, disposed in the first pad area 222, may align data inputted/outputted through a data pad DQ, in response to a clock signal inputted through a clock pad CLK. That is, the data alignment circuit 226 may align data that are sequentially inputted through the data pad DQ and then transmit the aligned data to the core area 210 through a global input output line GIO connected between the core area 210 and the first pad area 222. The data alignment circuit 226 may align data read from the plurality of memory cells through the global input output line GIO and then sequentially transmit the aligned data to the data pad DQ.

The data alignment circuit 226 is disposed to be overlapped with the corresponding data pad DQ, so that it is possible to reduce a length of a data line between the data alignment circuit 226 and the data pad DQ. However, since the data alignment circuit 226 has a relatively larger area than the data pad DQ, the memory device 200 may further include, in the first pad area 222, voltage pads VDD, VSS, and VDQ for receiving a power supply voltage, a ground voltage, and a voltage for a data pad DQ.

In such a case, the data pads DQ may be disposed symmetrically with respect to the voltage pads VDD, VSS, and VDQ. That is, two data pads DQ may be disposed symmetrically with respect to one voltage pad VDD, VSS, or VDQ, and such a structure of the data pads DQ and the voltage pads VDD, VSS, and VDQ may be repeatedly disposed.

Accordingly, the data alignment circuit 226 may be disposed in the upper portion of the corresponding data pad DQ and the upper portion of the voltage pad VDD, VSS, and VDQ adjacent to the corresponding data pad DQ. In other words, the data alignment circuit 226 may be disposed in a part perpendicular to the corresponding data pad DQ and voltage pad VDD, VSS, and VDQ adjacent to the corresponding data pad DQ. FIG. 2 illustrates an example in which the data pad DQ corresponding to the data alignment circuit 226 are adjacent to the voltage pad VDD for receiving the power supply voltage. In an embodiment shown in FIG. 2, the data alignment circuit 226 may be disposed in the upper portions of the data pad DQ and the voltage pad VDD. As a consequence, it is possible to ensure a space where the data alignment circuit 226 having a relatively larger area than the data pad DQ is disposed adjacent to the data pad DQ.

Referring to FIG. 2, the data alignment circuit 226 may be disposed to be overlapped with the corresponding data pad DQ and partially overlapped with the adjacent voltage pad VDD. Another data alignment circuit may be disposed to be overlapped with the remaining part (i.e., non-overlapped part) of the adjacent voltage pad VDD. That is, the data alignment circuits may share the upper portion of the adjacent voltage pad VDD.

Figure 3:
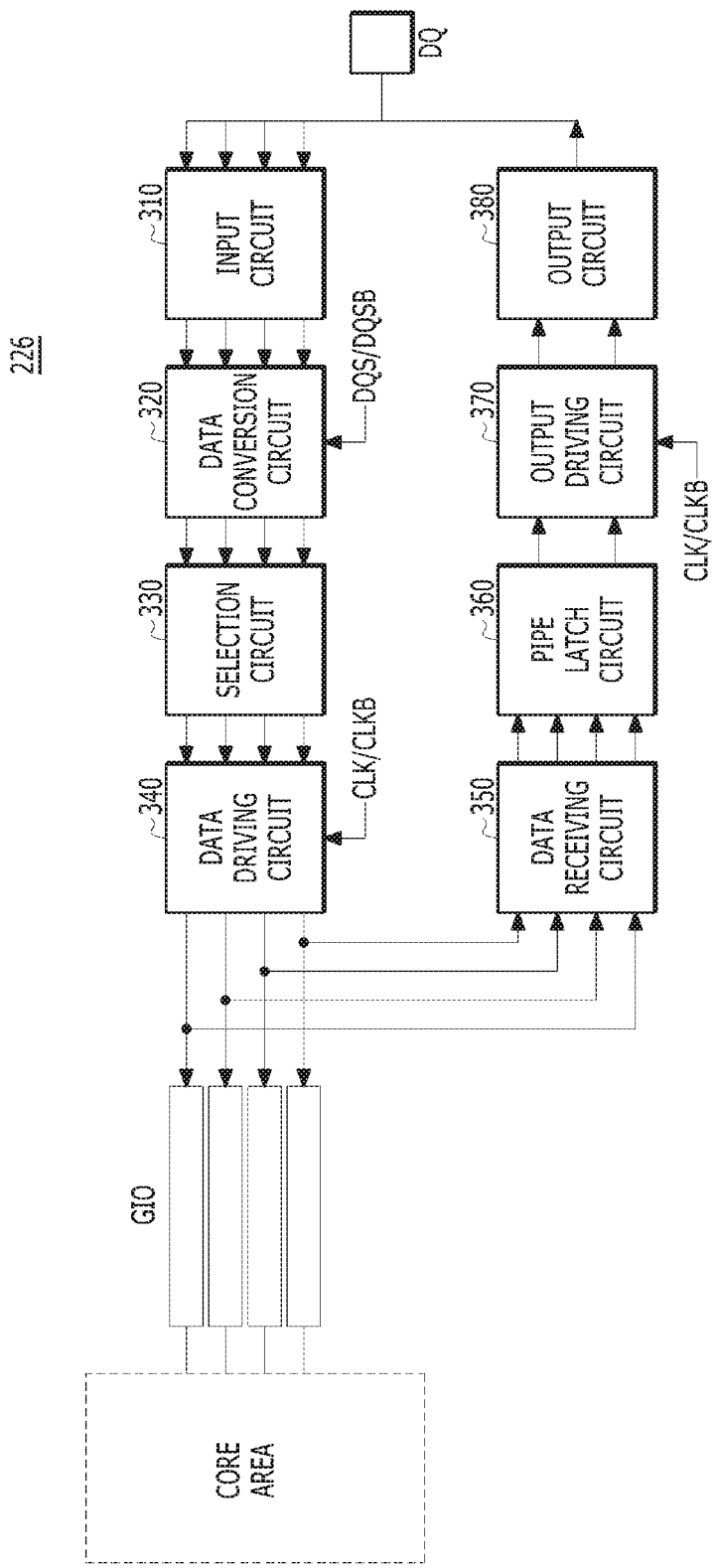
FIG. 3 is a diagram illustrating a data alignment circuit illustrated in FIG. 2.

FIG. 3 is a diagram illustrating the data alignment circuit 226 illustrated in FIG. 2.

The data alignment circuit 226 may parallelize data sequentially inputted to the data pad DQ and transmit the parallelized data to the core area through the global input output line GT©. To this end, the data alignment circuit 226 may include an input circuit 310, a data conversion circuit 320, a selection circuit 330, and a data driving circuit 340.

The input circuit 310 may include a plurality of input buffers. The input circuit 310 may receive data inputted through the data pad DQ, and transmit the data to the data conversion circuit 320. The data conversion circuit 320 may convert the data transmitted through the input circuit 310 into parallel data in response to data strobe signals DQS/DQSB. When the selection circuit 330 selects and outputs a plurality of parallel data converted by the data conversion circuit 320, the data driving circuit 340 may transmit the output data of the selection circuit 330 through the global input output line GIG in response to clock signals CLK/CLKB. For reference, the data strobe signal DQSB is a complementary signal of the data strobe signal DQS, and the dock signal CLKB is complementary signal of clock signal CLK.

The memory device 200 may include, in the first pad area 222, both the data conversion circuit 320 that performs an operation based on the data strobe signals DQS/DQSB and the data driving circuit 340 that performs an operation based on the clock signals CLK/CLKB. Accordingly, it is possible to reduce a difference in a path length between the data strobe signals DQS/DQSB and the clock signals CLK/CLKB. As a consequence, the memory device 200 may perform a domain crossing operation by adjusting the timing of a buffer, a repeater, and the like without a delay line having a relatively large amount of delay. The delay line may be removed and the sizes of driver circuits for driving the delay line may be reduced, so that it is possible to reduce the entire area and power consumption of the memory device 200.

Furthermore, the data alignment circuit 226 may sequentially output the parallel data, which are read through the global input output line GIO, to the data pad DQ. To this end, the data alignment circuit 226 may further include a data receiving circuit 350, a pipe latch circuit 360, an output driving circuit 370, and an output circuit 380.

The data receiving circuit 350 may receive data loaded on the global input output line GIO and selectively output the data according to a bandwidth that may be set. The pipe latch circuit 360 may store the output data of the data receiving circuit 350, convert the stored data into serial data, and output the serial data. The output driving circuit 370 may output the serial data converted by the pipe latch circuit 360 to the data pad DQ through the output circuit 380 in synchronization with the clock signals CLK/CLKB.

The data driving circuit 340 and the data receiving circuit 350 may share the global input output line GIO connected between the core area 210 and the first pad area 222 of the memory device 200. Accordingly, in the memory device 200, the number of data lines ('4', see FIG. 2) connected from the core area 210 to the first pad area 222, that is, the pad area 220 may be reduced. When the data driving circuit 340 and the data receiving circuit 350 are disposed in another area other than the pad area 220, the data driving circuit 340 and the data receiving circuit 350 do not share data lines between the disposed area and the pad area 220. Thus, the number of data lines ('6' to '8', see FIG. 1) may increase and the entire length of the data lines may increase.

Furthermore, the output driving circuit 370, which finally outputs the data in synchronization with the clock signals CLK/CLKB, is disposed in the first pad area 222, so that it is possible to reduce a path through which the data synchronized with the clock signals CLK/CLKB are outputted to the data pad DQ. According to the memory device 200, it is possible to reduce a delay that may additionally occur in the data synchronized with the clock signals CLK/CLKB and to output data at a more accurate timing.

According to the embodiment of the present invention, a plurality of input/output pads and circuits for aligning input/output data, may be optimally disposed in a limited area of the memory device. The plurality of input/output pads and circuits may share input/output lines, so that it is possible to reduce the entire area of the memory device. Therefore, it is possible to increase the die yield of the memory device.

Furthermore, the memory device may adjust a timing, at which a domain crossing operation is performed, without using a delay line having a relatively large amount of delay. As the delay line is removed from the memory device, the sizes of driver circuits for driving the delay line may be also reduced, so that it is possible to reduce power consumption as well as the area of the memory device.

While the present invention has been described with respect to the specific embodiments, it will be apparent to those skilled in the art that various changes and modifications may be made without departing from the spirit and scope of the invention as defined in the following claims.

What is claimed is:

1. A memory device comprising:
a data pad disposed in a first pad area and configured to receive data;
a data strobe pad disposed in the first pad area and configured to receive a data strobe signal;
a clock pad disposed in a second pad area adjacent to the first pad area and configured to receive a clock signal;
a data conversion circuit disposed in the first pad area and configured to convert the data inputted through the data pad into parallel data based on the data strobe signal; and
a data driving circuit disposed in the first pad area and configured to transmit the parallel data through a global input and output line based on the clock signal,
wherein the data conversion circuit and the data driving circuit are disposed over the data pad to be overlapped with the data pad in the first pad area.

2. The memory device of claim 1, further comprising:
a core area; and
a data receiving circuit disposed in the first pad area and configured to receive data transmitted from the core area through the global input and output line.

3. The memory device of claim 2, wherein the data driving circuit and the data receiving circuit share the global input and output line connected between the core area and the first pad area.

4. The memory device of claim 2, further comprising:
a pipe latch circuit configured to store the data received from the data receiving circuit and convert the stored data into serial data to output the serial data; and
an output driving circuit configured to output the serial data through the data pad in synchronization with the clock signal.

5. The memory device of claim 1, further comprising:
a voltage pad disposed in the first pad area and configured to receive a power supply voltage and a ground voltage.

6. The memory device of claim 5, wherein the data pad is disposed symmetrically to another data pad with respect to the voltage pad.

7. The memory device of claim 6, wherein the data conversion circuit and the data driving circuit are disposed in an upper portion of the data pad and the voltage pad adjacent to the data pad among a plurality of voltage pads.

8. A memory device comprising:
a plurality of data pads disposed in a first pad area and configured to input and output data;
a plurality of voltage pads disposed in the first pad area and configured to receive a power supply voltage and a ground voltage;

a plurality of clock pads disposed in a second pad area adjacent to the first pad area and configured to receive a clock signal; and a data alignment circuit disposed in the first pad area and configured to align the inputted and outputted data in response to the clock signal, wherein two data pads of the plurality of data pads correspond to one voltage pad of the plurality of voltage pads, which is disposed between the two data pads, wherein the data alignment circuit is disposed over the plurality of data pads and the plurality of voltage pads to be overlapped with the plurality of data pads and the plurality of voltage pads in the first pad area.

9. The memory device of claim 8, wherein the data alignment circuit is disposed an upper portion of a corresponding data pad among the plurality of data pads and a voltage pad adjacent to the corresponding data pad, among the plurality of voltage pads.

10. The memory device of claim 9, wherein the data alignment circuit is disposed partially in the upper portion of the adjacent voltage pad, and another data alignment circuit adjacent to the data alignment circuit is disposed partially in a remaining part of the upper portion of the adjacent voltage pad.

11. The memory device of claim 8, further comprising:
a data strobe pad disposed in the first pad area and configured to receive a data strobe signal.

12. The memory device of claim 11, wherein the data alignment circuit comprises:
a data conversion circuit configured to convert the data inputted to the plurality of data pads into parallel data in response to the data strobe signal; and
a data driving circuit configured to transmit the parallel data through a global input and output line in response to the clock signal.

13. The memory device of claim 12, wherein the data alignment circuit further comprises:
a data receiving circuit configured to receive data transmitted from a core area of the memory device through the global input and output line.

14. The memory device of claim 13, wherein the data driving circuit and the data receiving circuit share the global input and output line connected between the core area and the first pad area.

15. The memory device of claim 13, wherein the data alignment circuit further comprises:
a pipe latch circuit configured to store the data received from the data receiving circuit and convert the stored data into serial data to output the serial data; and
an output driving circuit configured to output the serial data to the plurality of data pads in synchronization with the clock signal.

16. A semiconductor device comprising:
a core area; and
a pad area including a first pad area and a second pad area disposed adjacent to the first pad area,
wherein a plurality of data pads configured to input and output data, a data strobe pad configured to receive a data strobe signal, and a plurality of voltage pads configured to receive a power supply voltage and a ground voltage are disposed in the first pad area,
wherein a clock pad configured to receive a clock signal is disposed in the second pad area, and
wherein a data alignment circuit configured to align the inputted and outputted data in response to the clock signal, is disposed over the plurality of data pads and the plurality of voltage pads to be overlapped with the plurality of data pads and the plurality of voltage pads in the first pad area.

17. The semiconductor device of claim 16, wherein two data pads of the plurality of data pads correspond to one voltage pad of the plurality of voltage pads, which is disposed between the two data pads.

18. The semiconductor device of claim 16, wherein a plurality of command/address pads configured to receive a commands/addresses are disposed in the second pad area.

19. The semiconductor device of claim 16, further comprising a global input and output line connected between the core area and the first pad area.

* * * * *